United States Patent [19]

Kurokawa et al.

[11] Patent Number: 6,063,540
[45] Date of Patent: May 16, 2000

[54] METHOD FOR MAKING LITHOGRAPHIC PRINTING PLATE

[76] Inventors: Hiroyuki Kurokawa; Toshiro Kondo, both of c/o Mitsubishi Paper Mills Limited, 4-2, Marunouchi-3-chome, Chiyoda-ku, Tokyo, Japan

[21] Appl. No.: 09/055,367

[22] Filed: Apr. 6, 1998

[30] Foreign Application Priority Data

Apr. 8, 1997 [JP] Japan ................................ 9-089445

[51] Int. Cl.[7] .............................. G03F 7/07; G03C 5/38; G03C 8/36; G03C 8/06
[52] U.S. Cl. ......................... 430/204; 430/249; 430/251; 430/459; 430/488
[58] Field of Search ..................... 430/204, 249, 430/251, 488

[56] References Cited

U.S. PATENT DOCUMENTS

| | | | |
|---|---|---|---|
| 5,200,294 | 4/1993 | De Keyzer et al. | 430/204 |
| 5,258,258 | 11/1993 | Matsubara et al. | 430/204 |
| 5,391,457 | 2/1995 | Hayashi et al. | 430/204 |
| 5,398,092 | 3/1995 | Tanno et al. | 430/204 |
| 5,536,618 | 7/1996 | De Keyzer et al. | 430/204 |
| 5,756,251 | 5/1998 | Kondo et al. | 430/204 |
| 5,834,156 | 11/1998 | Urasaki et al. | 430/204 |
| 5,851,723 | 12/1998 | Kondo | 430/204 |

*Primary Examiner*—Richard L. Schilling
*Attorney, Agent, or Firm*—Pillsbury Madison & Sutro

[57] ABSTRACT

Provided is a method for making a lithographic printing plate in which the development is carryied out by coating a developer on a photosensitive element comprising a support and at least a silver halide emulsion layer and a physical development nuclei layer, characterized in that coating amount of the developer is 60 ml or less for 1 $m^2$ of the photosensitive element, and the developer contains at least one thioether compound and at least one alkanolamine compound as silver halide solvents. The resulting lithographic printing plate is high in printing endurance and has no stains in non-image portions. Furthermore, the running development processing can be stably carried out.

3 Claims, No Drawings

METHOD FOR MAKING LITHOGRAPHIC PRINTING PLATE

BACKGROUND OF THE INVENTION

The present invention relates to a method for making lithographic printing plates utilizing silver complex diffusion transfer process, and particularly to a method for making lithographic printing plate using coating development process.

Lithographic printing is carried out by feeding both water and ink to the surface of printing plates to allow the image portions to receive preferentially the coloring ink and the non-image portions to receive preferentially water and transferring the ink on the image portions onto a substrate such as paper.

Lithographic printing plates using silver complex diffusion transfer process (DTR process), particularly, those which have a silver halide emulsion layer and a physical development nuclei layer are disclosed in, for example, U.S. Pat. Nos. 3,728,114, 4,134,769, 4,160,670, 4,336,321, 4,501,811, 4,510,228, and 4,621,041.

The exposed silver halide crystals undergo chemical development in the emulsion layer by development treatment and become black silver to form hydrophilic non-image portions. On the other hand, the unexposed silver halide crystals are dissolved by the action of a silver halide complexing agent contained in a developer and diffuse to the surface physical development nuclei layer to be precipitated on the physical development nuclei as an ink-receptive image silver by the reducing action of developing agent.

The DTR process has such a mechanism that a chemical development and a dissolving physical development proceed simultaneously in a single development treatment. Therefore, in order to obtain good prints, important is balance of developing speed between the area where chemical development takes place to form a non-image portion and area where dissolving physical development takes place to form an image portion.

For example, if the dissolving physical development takes precedence over the chemical development, this causes stains on non-image portions or decrease in contrast of images, resulting in insufficient printing endurance. If the chemical development takes precedence over the physical development, this causes insufficient printing endurance.

Actually practiced processing method for making lithographic printing plates using DTR process generally employs an automatic process camera in which a developing tank is incorporated. That is, after exposure by the process camera, the plate is allowed to pass through a developing tank containing a large amount of a developer, and then the developer remaining on the plate surface is removed by a mechanical method, for example, allowing the plate to pass between squeeze rollers having a contact pressure. Then, the plate is allowed to pass through a neutralizing solution tank to adjust the pH of the plate surface, and the neutralizing solution remaining on the plate surface is removed by a mechanical method as in the case of removal of the developer.

According to the above processing method, amount of waste developer increases conspicuously in the case of processing a large quantity of plates, and maintenance or disposal of the waste developer is a great burden on users both environmentally and economically.

Furthermore, a lot of time is taken because the plate passes through the developing tank and the neutralizing solution tank, and exhaustion of developer such as decrease of pH and formation of sludge occurs owing to processing of a large number of plates.

As processing methods which solves these problems, JP-A-48-76603 and JP-A-57-115549, and U.S. Pat. No. 5,398,092 disclose a method of plate making in which a developer is fed onto a lithographic printing plate by coating the plate surface with the developer, and WO95/18400 discloses a processing method which comprises coating the plate surface with a developer by instantaneously dipping the plate in the developer contained in a very small developing tank. However, such coating development process suffers from various problems under the conditions different from those of practically employed dipping development process. These problems make it difficult to put the coating development process to practical use.

That is, in the above-mentioned coating development processes, fresh developer is not supplied to the plate surface after the plate surface has been coated with the developer, and if coating amount of the developer is decreased for reducing the amount of waste developer, the balance between the chemical development and the physical development is readily lost due to a slight deflection of the coating amount of the developer. As a result, the resulting printing plate is often stained in non-image portions or low in printing endurance.

In addition, a serious problem caused by decreasing the coating amount of developer is that temperature control of the developer is very difficult. For this reason, temperature of the developer is apt to lower and printing performance is extremely deteriorated. Thus, such a measure as using a roller for heating the plates or keeping the temperature around the developing part at constant has been adopted. In this case, however, water in the developer is evaporated and composition of the developer gradually changes, making the problems more serious.

According to a preferred embodiment of the coating development process, an excess amount of developer is previously fed to the photosensitive surface of the plate, a desired amount of the developer is coated on the photosensitive surface by a roller or blade, and an excess developer which has not been coated is recovered and reused. This is preferred from the points of uniform coating and reduction of the amount of waste developer. However, this coating development process has the problems that the developer contacts with air for a long period and pH of the developer tends to lower due to absorption of carbon dioxide in the air. Especially, pH of the developer greatly lowers in running processing in which a large number of plates are processed over several days, and the resulting printing plates are deteriorated in printing performance.

On the other hand, JP-A-5-127387 and U.S. Pat. Nos. 5,200,294 and 5,536,618 disclose use of a thioether compound alone or in combination with an alkanolamine in making lithographic printing plates using silver complex diffusion transfer process, but they do not mention to lower the temperature dependence of developer in the coating development process by using these compounds in combination.

SUMMARY OF THE INVENTION

The first object of the present invention is to provide a method of plate making according to which when a lithographic printing plate is made using DTR process by a coating development with a small amount of developer, change of composition of the developer caused by excess heating treatment can be diminished by using a developer low in temperature dependence and printing plates of high printing endurance which are free from staining in non-image portions can be stably obtained. The second object is to make it possible to miniaturize the developing apparatus by simplifying the heating apparatus, and to attain simplification of maintenance. The third object is to provide a method of stable plate making in which pH does not lower in running processing.

The above objects have been attained by a method for making a lithographic printing plate which comprises developing a photosensitive element comprising a support and, provided thereon, at least a silver halide emulsion layer and a physical development nuclei layer by coating a developer, wherein coating amount of the developer is 60 ml or less per 1 m² of the photosensitive element, and the developer contains at least one thioether compound and at least one alkanolamine compound.

The temperature dependence of the developer can be greatly lowered by using a thioether compound and a alkanolamine compound in combination, and lithographic printing plates having good printing characteristics can be obtained even by using the coating development process. These effects can be obtained only by using the two compounds in combination and cannot be obtained by using only one of them.

DETAILED DESCRIPTION OF THE INVENTION

The coating development process in the present invention is generally a process which comprises coating a developer on the photosensitive surface of the silver halide emulsion layer, which is disclosed in JP-A-48-76603 and others. This process includes, for example, a developer dipping-up coating process, a dripping roller coating process, a dripping knife coating process, a spray coating process, and a brush coating process. Other preferred processes are a roller coating process using a bar coater (e.g., manufactured by Eto Chemical Apparatus Co.) as disclosed in U.S. Pat. No. 5,398,092 and a dip coating development process disclosed in WO95/18400.

Coating amount of the developer on the photosensitive surface is 10–60 ml/m², preferably 20–50 ml/m², and developing time (from coating of the developer until termination of exhibition of the developing effect by the developer) is 15 seconds or less, preferably 3–10 seconds.

The thioether compounds used in the present invention are represented by the following formula (I).

$$R_1-(S-R_3)_m-S-R_2 \quad (I)$$

(wherein $R_1$ and $R_2$ each represent an alkyl group and may be the same or different and may link to each other to form a ring, the alkyl group may be substituted with amino group, amide group, ammonium group, hydroxyl group, sulfo group, carboxyl group, aminocarbonyl group, aminosulfonyl group or the like; the alkyl group preferably has 1–5 carbon atoms; $R_3$ represents an alkylene group which may contain other divalent group; and m represents 0 or an integer of 1–4, and when m is 2 or more, $R_3$ may be the same or different.)

Examples of the thioether compounds used in the present invention are shown below.

$HO(CH_2)_2S(CH_2)_2OH$ (1)

$CH_3SCH_2CHCOOH$ (2)
   |
   $NH_2$ $HO(CH_2)_2S(CH_2)_2N(CH_3)_2$ (3)

$CH_3S(CH_2)_2CH(NH_2)COOH$ (4)

$HO(CH_2)_2SCH_2S(CH_2)_2OH$ (5)

$HO(CH_2)_2S(CH_2)_2S(CH_2)_2OH$ (6)

$HO(CH_2)_2S(CH_2)_3S(CH_2)_2OH$ (7)

$C_2H_5S(CH_2)_2SCH_2CHOHCH_2OH$ (8)

$HOOCCH_2SCH_2SCH_2COOH$ (9)

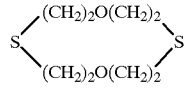

(10)

$HO(CH_2)_3S(CH_2)_2S(CH_2)_3OH$ (11)

$HOOCCH_2S(CH_2)_2SCH_2COOH$ (12)

$HO(CH_2)_2S(CH_2)_4S(CH_2)_2OH$ (13)

$HOOCCH_2S(CH_2)_3SCH_2COOH$ (14)

$HOOC(CH_2)_2S(CH_2)S(CH_2)_2COOH$ (15)

$(HO(CH_2)_2S(CH_2)_2)_2O$ (16)

$H_2NCO(CH_2)_2S(CH_2)_2S(CH_2)_2CONH_2$ (17)

$HOOC(CH_2)_2S(CH_2)_2S(CH_2)_2COOH$ (18)

$(HOCH_2CHOHCH_2SCH_2)_2$ (19)

$HOOC(CH_2)_2S(CH_2)_3S(CH_2)_2COOH$ (20)

$C_2H_5S(CH_2)_2S(CH_2)_2NHCO(CH_2)_2COOH$ (21)

$HO(CH_2)_3S(CH_2)_2O(CH_2)_3O(CH_2)_2S(CH_2)_2OH$ (22)

$HO(CH_2)_6S(CH_2)_5S(CH_2)_6OH$ (23)

The thioether compounds represented by the formula (I) may be used each alone or in combination of two or more.

The alkanolamines used in the present invention include, for example, (2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, and 2-methylaminoethanol. These may be used each alone or in combination of two or more.

Thioether compounds and alkanolamines are both known as silver halide solvents, and it is also known in DTR printing plates that they can produce transfer silver having good printing characteristics. However, use of thioether compound or alkanolamine each alone cannot provide a developer low in temperature dependence which is suitable to be used for the plate making method by coating development according to the present invention, and, therefore, transfer silver of high printing endurance cannot be formed. On the other hand, lithographic printing plates having good printing characteristics can be stably obtained by using the two compounds in combination to lower the temperature dependence of developer.

Total amount of the thioether compound and the alkanolamine as silver halide solvents added to developer is 0.1–100 g, preferably 1–50 g per 1 liter of the developer, and molar ratio of thioether compound: alkanolamine compound is 1:6–1:60, preferably 1:10–1:40. When they are added in these ranges, the desired effects of the present invention are conspicuous.

In the present invention, meso-ionic compounds, thiosulfates, thiosalicylic acid, cyclic imides, etc. can be additionally used as silver halide solvents other than the thioether compounds and alkanolamines.

In the present invention, content of Na ion in the developer is preferably 50–85 mol %, more preferably 55–80 mol % based on the total alkali metal ions. More preferably, Na ion is contained in an amount of 0.6 mol or more in 1 liter of the developer, and most preferably it is contained in an amount of 0.7–1.2 mols. Preferably, the developer additionally contains K ion as an alkali metal ion other than Na ion. Na ion and K ion may be added in any form and by any manner, and they may be in the form of hydroxide, sulfite, carbonate, silicate, nitrate or the like.

The inventors have found that decrease of pH of developer in running processing can be inhibited by increasing the content of Na ion. However, mere increase of the content of Na ion results in deterioration of printing endurance or ink receptivity which is considered to be caused by the change in balance of speed of chemical development and dissolving physical development. As a result of further investigation conducted by the inventors, it has been found that use of the thioether compound and the alkanolamine in combination solves the above problem caused by the increase of Na ion, and furthermore makes it possible to inhibit the decrease of pH in running processing.

Moreover, it is preferred that the developer contains a compound having mercapto group or thione group as oleophilizing agent to improve ink receptivity of silver image portions. As examples of the compounds, mention may be made of those disclosed in JP-B-48-29723 and JP-A-58-127928. Especially preferred are nitrogen-containing heterocyclic compounds having oleophilic group such as alkyl, aryl or alkenyl group of 3–12 carbon atoms.

The nitrogen-containing heterocyclic rings include 5- or 6-membered rings, and examples thereof are imidazole, imidazoline, thiazole, thiazoline, oxazole, oxazoline, pyrazoline, triazole, thiadiazole, oxadiazole, tetrazole, pyridine, pyrimidine, pyridazine, pyrazine, and triazine. These rings may be condensed rings produced by condensation of two or more rings, or those condensed with benzene ring or naphthalene ring.

Examples of the nitrogen-containing heterocyclic compounds are 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-1,3,4-oxathiazole, 2-mercapto-5-n-heptyl-oxadiazole, 2-mercapto-5-phenyl-1,3,4-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine, and 2-amino-4-mercapto-6-benzyl-1,3,5-triazine. The compounds are not limited to these examples.

Among them, especially preferred are compounds having oxadiazole ring or thiadiazole ring containing aliphatic group of 5 or more carbon atoms as an oleophilic group.

Amount of the oleophilizing agent is 0.01–50 millimols, preferably 0.05–30 millimols per 1 liter of the developer.

In the developer of the present invention, it is preferred to use the above compound having mercapto group or thione group in combination with a polyoxyethylenesorbitan fatty acid ester or a polyoxyethylenesorbitol fatty acid ester. These compounds are a group of nonionic surface active agents prepared by esterification reaction of a sorbitan or sorbitol having an ethyleneoxy group added thereto with a higher fatty acid. The number of recurring unit of ethyleneoxy group is 5 or more and the total number is 5–180, and the fatty acid preferably has 10 or more carbon atoms, and examples thereof are lauric acid, palmitic acid, stearic acid, and oleic acid. The fatty acid esters can have a form of mono, di, tri, tetra or the like. Examples of the polyoxyethylenesorbitan fatty acid esters are NIKKOL TP-10, TS-10, TS-30, TO-10, and TO-30 manufactured by Nikko Chemical Co., Ltd., and NONION LT-221, PT-221, ST-221, and OT-221 manufactured by Nippon Oil & Fats Co., Ltd. As examples of the polyoxyethylenesorbitol fatty acid esters, NIKKOL GO-460, GS-460, etc. are commercially available. Representatives of the compounds used in the present invention are enumerated below, but the compounds are not limited to these examples.

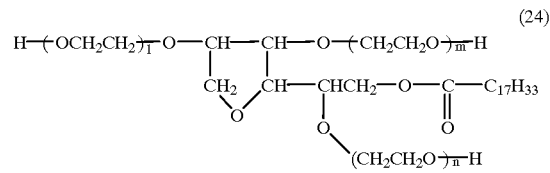

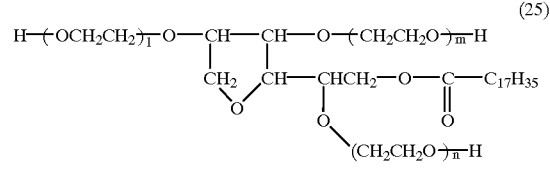

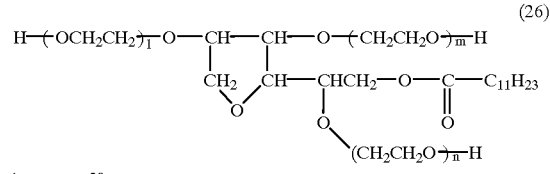

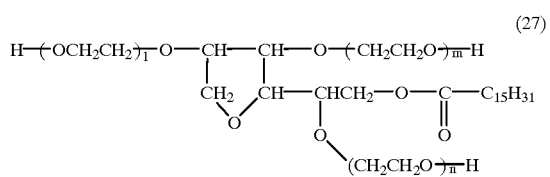
(27)

$l + m + n = 20$

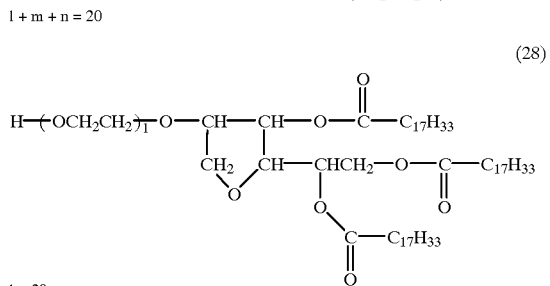
(28)

$l = 20$

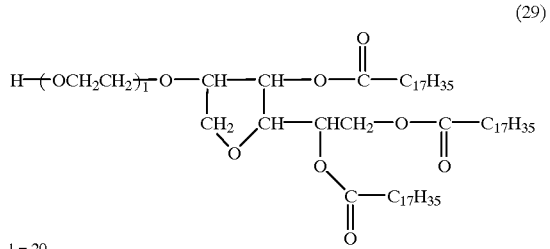
(29)

$l = 20$

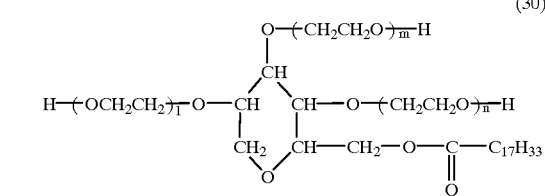
(30)

$l + m + n = 20$

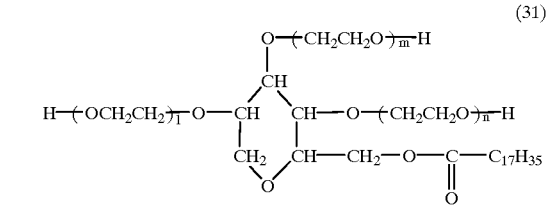
(31)

$l + m + n = 20$

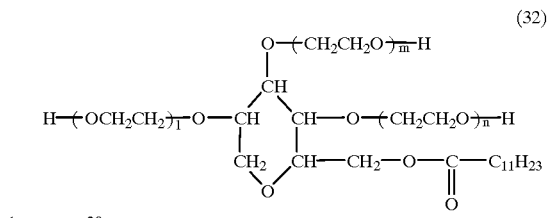
(32)

$l + m + n = 20$

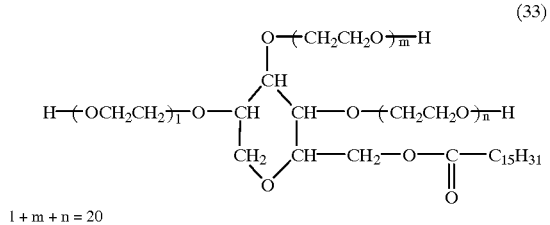
(33)

$l + m + n = 20$

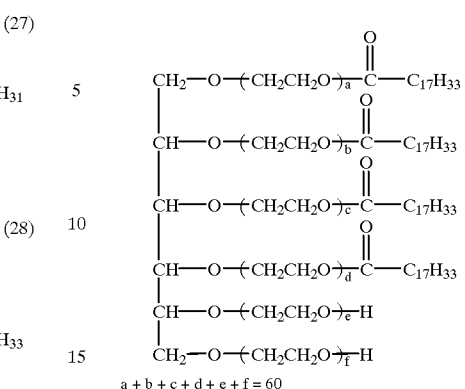
(34)

$a + b + c + d + e + f = 60$

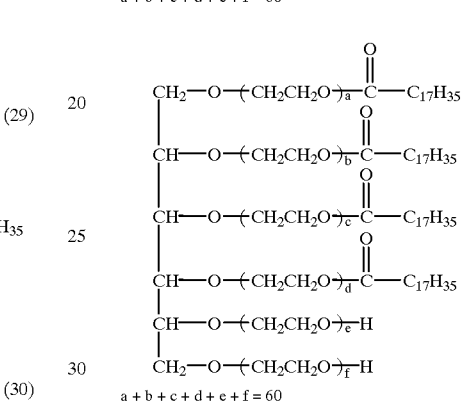
(34)

$a + b + c + d + e + f = 60$

Amount of the above compounds added to the developer is 0.1–10 g/liter, preferably 0.2–5 g/liter. These compounds may be used each alone or in combination of two or more.

It is known that the compound having mercapto group or thione group is adsorbed to the physically developed silver image to improve ink receptivity. However, this effect gradually decreases by running processing, and furthermore the compound promotes formation of silver sludge. These are undesirable side effects. As a result of intensive research by the inventors, it has been found that unexpected effects can be obtained by carrying out the development with a developer containing the compound having mercapto group or thione group and the above-mentioned nonionic surface active agent, namely, the ink receptivity is further improved, the characteristics are not deteriorated at the time of running processing, and formation of silver sludge can be inhibited.

The developer used in the present invention can contain, in addition to the above compounds, alkaline substances such as sodium hydroxide, potassium hydroxide, lithium hydroxide, sodium tertiary phosphate, etc; preservatives such as sulfites, etc.; thickening agents such as hydroxymethylcellulose, carboxymethylcellulose, etc; anti-foggants such as potassium bromide, compounds disclosed in JP-A-47-26201, etc.; developing agents such as hydroquinone, 1-phenyl-3-pyrazolidone, etc.

When the DTR process is carried out, the developing agent may be contained in the silver halide emulsion layer and/or the image receiving layer or other water permeable hydrophilic colloid layers contiguous to the image receiving layer as described in British Patent Nos. 1,000,115, 1,012, 476, 1,017,273, and 1,042,477. Therefore, in such case, a so-called "alkaline activation solution" containing no developing agent can be used as a processing solution in developing stage.

In the present invention, a neutralizing solution is applied after development treatment. This serves to neutralize pH on the plate surface and stabilize it. The neutralizing solution may contain usually employed buffers, preservatives, antiseptic agents, wetting agents, surface active agents, etc. As the buffers, inorganic acids such as phosphoric acid, sulfuric acid, etc., and organic acids such as succinic acid, propionic acid, etc. are used to keep pH at 5–7. Furthermore, the neutralizing solution may further contain complexing agents such as iminodiacetic acid, ethylenediaminetetraacetic acid, etc. and inorganic fine particles such as colloidal silica, etc. Moreover, it is preferred to add the above-mentioned oleophilizing agents.

A preferred embodiment of the photosensitive element from which a lithographic printing plate is made by silver complex diffusion transfer process comprises a support and an undercoat layer, a silver halide emulsion layer and a physical development nuclei layer coated in succession on the support.

The photosensitive element according to the present invention contains gelatin as a binder, and the gelatin can be contained in the undercoat layer, the emulsion layer and the physical development nuclei layer. A part of the gelatin may be replaced with one or more of hydrophilic polymers such as starch, dextrin, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, polyvinyl methyl ether-maleic anhydride copolymer, etc.

These gelatin-containing layers can be hardened with gelatin hardeners. The gelatin hardeners include, for example, inorganic compounds such as chrome alum, aldehydes such as formalin, glyoxal, malealdehyde, glutaraldehyde, etc., N-methylol compounds such as urea, ethyleneurea, etc., aldehydes such as mucochloric acid, 2,3-dihydroxy-1,4-dioxane, etc., compounds having active halogen such as 2,4-dichloro-6-hydroxy-S-triazine salts, 2,4-dihydroxy-6-chloro-S-triazine salts, etc., divinyl sulfone, divinyl ketone, N,N,N-triacryloylhexahydrotriazine, compounds having, in the molecule, two or more ethyleneimino groups or epoxy groups which are active 3-membered rings, and dialdehyde starch as polymeric hardeners. These may be used each alone or in combination of two or more.

The hardener can be added to all layers, some layers or only one layer. Of course, when two layers are simultaneously coated, a diffusible hardener can be added to only either one layer. The hardener can be added during preparation of emulsion or in line with coating of the layers.

In the present invention, it is preferred to use a matting agent having an average particle size of 0.3–5.0 microns in the layers on the side of the support which has the emulsion layer. The matting agent used in the present invention includes, for example, silica particles and organic particles such as styrene. Especially preferred are silica particles of low oil absorption disclosed in JP-A-7-168360. Specific examples of such silica particles include CARPLEX manufactured by Shionogi & Co., Ltd. (average particle size: 1.2 microns), etc.

The matting agent is preferably contained in the undercoat layer provided between the support and the silver halide emulsion layer. Amount of the matting agent which may vary depending on various conditions is 0.1–5.0 g/m$^2$, preferably 0.3–3.5 g/m$^2$ in the layers containing the matting agent on the side of the emulsion layer being present.

The undercoat layer may contain pigments or dyes such as carbon black for the purpose of antihalation. The layer may further contain photographic additives such as developing agent, etc. The undercoat layer may be one as disclosed in JP-A-48-5503, JP-A-48-100203 and JP-A-49-16507.

In the present invention, it is preferred to use a latex which is non-swelling with water, in the undercoat layer. The non-swelling latex means a latex less in swelling with water, and includes, for example, styrene-butadiene type latex, polybutadiene type latex, polystyrene type latex, styrene-isoprene type latex, or the like. Among them, styrene-butadiene type latex is preferred. Amount of the latex is 0.2–5.0 g/m$^2$ in terms of solid matter.

It is considered that by allowing the latex to be contained in the undercoat layer, swelling of the developer is delayed and DTR activity can be readily maintained in the development carried out with a small amount of developer for a short time as in the coating development.

As silver halide emulsions, there may be used silver chloride, silver bromide, silver chlorobromide, silver chloroiodide, silver chlorobromoiodide, and the like, and preferred are silver halides containing 70 mol % or more of silver chloride. These silver halides may contain spectral sensitizers (spectral sensitizing dyes depending on light sources and uses, such as of camera type, laser beam type, color separation panchromatic type, and the like), gelatin hardeners, coating aids, antifoggants, plasticizers, developing agents, matting agents, and the like.

As the supports, there may be used paper, various films, plastics, papers coated with resinous materials, metals, and the like.

The physical development nuclei used are those which are known and include, for example, metals such as antimony, bismuth, cadmium, cobalt, palladium, nickel, silver, lead and zinc, and sulfides of these metals. The physical development nuclei described in JP-A-5-265164 can also be used. The physical development nuclei layer may also contain developing agents and water-soluble binders.

The lithographic printing plates made by the present invention can be rendered ink receptive or enhanced in ink-receptivity with compounds, for example, those disclosed in JP-A-48-29723 and U.S. Pat. No. 3,721,539.

Printing method and etch solution, dampening solution and the like may be those generally known to the art.

DESCRIPTION OF THE PREFERRED EMBODIMENTS

The present invention will be explained by the following nonlimiting examples.

EXAMPLE 1

Developing apparatus described in U.S. Pat. No. 5,398,092 was used as the developing apparatus of coating type.

A photosensitive element of 254 mm in width and 400 mm in length which was composed of a subbed polyester film support and an antihalation layer containing silica particles, an orthochromatically sensitized silver chloride emulsion layer, and a physical development nuclei layer coated on the support in succession in this order was used for making lithographic printing plates using DTR process. These photosensitive elements (10 plates) were subjected to exposure of thin line images by a process camera having image reversal mechanism.

As processing solutions, the following developers A–E and stabilizing solution (neutralizing solution) were used. Test on temperature dependence was conducted with changing the temperature of the developer to 25° C., 30° C.

(standard), and 35° C. Temperature of the stabilizing solution was 30° C. Coating amounts of the developer and the stabilizing solution were both 40 ml/m², and after lapse of 8 seconds from coating of the developer, the stabilizing solution was coated.

| <Developer> | |
| --- | --- |
| Potassium hydroxide | 17 g |
| Sodium hydroxide | 7 g |
| Potassium sulfite | 44 g |
| Thioether compound (6) | x g |
| N-(2-aminoethyl)ethanolamine | y g |
| 2-Mercapto-5-n-heptyloxa-3,4-diazole | 0.1 g |
| Water to make up 1000 ml in total. | |

Developers A–E as shown in Table 1 were prepared with changing x g and y g in the above formulation of developer.

TABLE 1

| Developer | x (g) | y (g) | |
| --- | --- | --- | --- |
| Developer A | 13 | — | Comparative |
| Developer B | 25 | — | Comparative |
| Developer C | — | 13 | Comparative |
| Developer D | — | 25 | Comparative |
| Developer E | 1 | 12 | The present invention |

X:y in the developer E was 1:23 in molar ratio.

| <Stabilizing solution> | |
| --- | --- |
| Potassium phosphate | 32 g |
| Phosphoric acid | 2 g |
| Sodium sulfite | 3 g |
| EDTA-Na | 1 g |
| Water to make up 1000 ml in total | |

An etch solution was applied to the whole plate surface, and printing was carried out by HEIDELBERG TOK offset printing machine using a dampening solution used for DTR lithographic printing plates.

The lithographic printing plates made using developers A and C were high in dependence on developing temperature to cause great change in photographic characteristics depending on the developing temperature, and, as a result, the printability also greatly changed. Especially, on the lower temperature side (25° C.), printing endurance lowered and stains in non-image portions occurred. The lithographic printing plates made using developers B and D were relatively low in dependence on developing temperature, but 5–6 plates among 10 plates showed stains in non-image portions. On the other hand, the lithographic printing plates made using developer E of the present invention were low in dependence on developing temperature and all of the 10 plates processed at any developing temperatures were superior in ink receptivity, and showed no stains in non-image portions before printing of 5000 prints and had a high printing endurance.

For reference, the above procedure was repeated, except that coating amount of the developer and the stabilizing solution was 80 ml/m², respectively. All of the resulting lithographic printing plates made using any of the developers were low in dependence on developing temperature, were superior in ink receptivity and high in printing endurance, and showed no stains in non-image portions.

EXAMPLE 2

Example 1 was repeated, except that N-methylethanolamine or 4-aminobutanol was used in place of N-(2-aminoethyl)ethanolamine in the developer. The results obtained were similar to those of Example 1.

EXAMPLE 3

Developer F was prepared by replacing most of potassium sulfite in the developer E of Example 1 with sodium sulfite to adjust amount of sodium ion to 50 mol % of total alkali metal ions (total of potassium ion and sodium ion), and the test was conducted in the same manner as in Example 1. As a result, all of the resulting 10 lithographic printing plates made using any developing temperatures (25° C., 30° C., 35° C.) were superior in ink receptivity, and showed no stains in non-image portions before printing of 6000 prints and were high in printing endurance.

EXAMPLE 4

Developer G was prepared by replacing most of potassium sulfite in the developer E of Example 1 with sodium sulfite to adjust amount of sodium ion to 70 mol % of total alkali metal ions (total of potassium ion and sodium ion). A developing apparatus mentioned in WO95/18400 was used in place of the developing apparatus of coating type used in Example 1. The test was conducted in the same manner as in Example 1. As a result, all of the resulting 10 lithographic printing plates made using any developing temperatures (25° C., 30° C., 35° C.) were superior in ink receptivity, and showed no stains in non-image portions before printing of 6000 prints and were high in printing endurance.

Next, running processing was carried out by repeating, for 5 days, the processing of 10 plates per 1 day using the same developer and developing apparatus as above. The printing plates made on the 1st day and the 5th day were tested on ink receptivity and printing endurance to find no difference between these printing plates and the stability in running processing was attained.

EXAMPLE 5

Developer H was prepared by further adding 1 g/liter of compound (24) to the developer of Example 4. In the same manner as in Example 4, running processing was carried out by repeating, for 10 days, the processing of 10 plates per 1 day using the developer H. The printing plates made on the 1st day and the 10th day were tested on ink receptivity and printing endurance to find no difference between these printing plates and the stability of running processing was further improved. Furthermore, substantially no silver sludge stuck to roller and others even after processing for 10 days, and, therefore, no silver sludge stuck to the printing plates at the time of processing.

EXAMPLE 6

Example 5 was repeated, except that compound (34) was used in place of the compound (24) in the developer. As a result, the same results as in Example 5 were obtained.

What is claimed is:

1. A method for making a lithographic printing plate which comprises carrying out development by coating a developer on a photosensitive element comprising a support and at least a silver halide emulsion layer and a physical development nuclei layer wherein coating amount of the developer is 60 ml or less per 1 m² of the photosensitive element and the developer contains at least one thioether compound and at least one alkanolamine compound as silver halide solvents wherein i) the lithographic printing plate is exposed imagewise to light prior to development, ii) the thioether compound is represented by the following formula:

  (I)

wherein $R_1$ and $R_2$ each represents an alkyl group and may be the same or different, $R_3$ represents an alkylene group, and m represents 0 or an integer of 1–4, and when m is 2 or more, $R_3$ maybe the same or different, iii) the developer contains a molar ratio of the thioether compound to the alkanolamine compound to be 1:6–1:60, and iv) development occurs during a time of 15 seconds or less.

2. A method according to claim 1, wherein the developer contains a compound having mercapto group or thione group and a polyoxyethylenesorbitan fatty acid ester or a polyoxyethylenesorbitol fatty acid ester.

3. A method according to claim 1, wherein the developing time is 3–10 seconds, and the developer contains a molar ratio of the thioether compound to the alkanolamine compound to be 1:10–1:40.

* * * * *